United States Patent [19]
Guiga et al.

[11] Patent Number: 5,166,625
[45] Date of Patent: Nov. 24, 1992

[54] AUTOMATIC DEVICE FOR MEASURING THE NOISE LEVEL OF ELECTRONIC COMPONENTS

[75] Inventors: Angelo Guiga, Seyssinet Pariset; Christian Lucas, Saint Egreve, both of France

[73] Assignee: Commissariat a l'Energie Atomique, Paris, France

[21] Appl. No.: 697,071

[22] Filed: May 8, 1991

[30] Foreign Application Priority Data

May 17, 1990 [FR] France ............... 90 06172

[51] Int. Cl.[5] ............... G01R 31/26; G01R 13/20
[52] U.S. Cl. ............... 324/613; 324/73.1; 324/603; 324/611
[58] Field of Search ............... 209/571; 324/73.1, 603, 324/613, 611, 158 R

[56] References Cited

U.S. PATENT DOCUMENTS

| | | | |
|---|---|---|---|
| 3,692,987 | 9/1972 | Bos | 324/613 |
| 4,458,197 | 7/1984 | Robinson | 324/73.1 |
| 4,524,444 | 6/1985 | Efron | 324/73.1 |
| 4,544,879 | 10/1985 | Maeda | 324/73.1 |
| 4,891,577 | 1/1990 | Ishikawa | 324/73.1 |
| 4,908,570 | 3/1990 | Gupta | 324/73.1 |

FOREIGN PATENT DOCUMENTS 2381316  9/1978  France .

OTHER PUBLICATIONS

IEEE Transactions on Nuclear Science, vol. NS-31, No. 1, Feb. 1984, pp. 465-469, C. E. Cox et al.
Radio Fernsehen Elektronic, vol. 29, No. 6, 1980, pp. 387-389, R. Palm et al.
Microwave Journal, vol. 31, No. 9, Sep., 1988, pp. 275-278.

*Primary Examiner*—Kenneth A. Wieder
*Assistant Examiner*—Jose M. Solis
*Attorney, Agent, or Firm*—Pearne, Gordon, McCoy & Granger

[57] ABSTRACT

Automatic device for measuring the noise level of electronic components. This device comprises selection means (20) to which are connected the components and which are able to select one of these components, measuring means (28) able to determine the noise of the selected component, said measuring means incorporating means (32,34) for biasing the selected component and for processing signals supplied by the thus biased selected component and also incorporating analysis means (36) determining the noise from signals supplied by the processing means, as well as means (10) for controlling the selection means (20) and measuring means (28), said control means (10) being electrically decoupled from the selection means (20) and the biasing and processing means (32,24). Application to the sorting of electronic components following their manufacture.

9 Claims, 3 Drawing Sheets

AUTOMATIC DEVICE FOR MEASURING THE NOISE LEVEL OF ELECTRONIC COMPONENTS

BACKGROUND OF THE INVENTION

The present invention relates to an automatic device for measuring the noise of electronic components and in particular in the low frequency range (0.01 Hz to 1 MHz). It more particularly applies to the detection of faults for the sorting of components, for establishing quality criteria, for aiding the statistical studies of quality problems and for analysing and correlating with models the detected noise sources.

Several measurement types are known, which make it possible to detect faults in electronic and, in particular, microelectronic components. One important measurement relates to the determination of the noise level produced by the components. In analog-type applications, e.g. in imaging, the performance characteristics of the components used are generally limited by the noise level. For example, in the low frequency range, components such as infrared radiation photovoltaic detectors having defects, produce an abnormally high noise level. Thus, giving an acceptable noise level threshold for a given frequency range defines a quality criterion making it possible to reject defective components. The determination of other characteristics, such as the intensity curve as a function of the voltage applied to the component can complete the noise measurement.

In a conventional manner, the components to be tested are successively connected to the characterization device, a connected component being tested, disconnected and then replaced by the following component. Therefore, there are numerous manipulations for each component, which makes it problematic to characterize a large number of such components. Thus, in the case of several determinations of characteristics for each component, the manipulations are multiplied and, consequently, the necessary sequence of operations is even more tedious.

SUMMARY OF THE INVENTION

The present invention obviates these disadvantages. The invention solves the problem of the automatic measurement of the noise of electronic components. In order to solve this problem, the device according to the invention successively selects components previously connected thereto and performs the noise measurement (and optionally other measurements) on the selected component. In this way grouping takes place of the different stages of the characterization procedure, which speeds up and makes less problematical the handling operations.

More specifically, the present invention relates to a device for measuring the noise of electronic components, characterized in that it comprises selection means to which are connected the components and which are able to select one of these components, measuring means able to determine the noise of the selected component, said measuring means incorporating means for biasing the selected component and for processing signals supplied by the thus biased selected component and also incorporating analysis means determining the noise from signals supplied by the processing means, as well as means for controlling the selection means and measuring means, said control means being electrically decoupled from the selection means and the biasing and processing means.

The measuring means can be able to determine the noise of the selected component in at least part of the frequency range 0.01 Hz to 1 MHz. This is especially useful for components intended to receive and supply analog signals, particularly in the field of imaging where the frequency range used is in the low frequency range and often between 10 Hz and 1 MHz or between 0.1 Hz and 100 kHz.

The noise can be measured over the entire considered frequency spectrum. Thus, during the characterization of components, it is of interest to obtain complete information on the components throughout the frequency range used. This makes it possible to detect possible abnormal measuring conditions, smooth the curve and therefore possibly link the measurements carried out with theoretical models concerning low frequency noise, e.g. in semiconductors.

Noise measurements in the low frequency range cause problems. The noise of the components is generally low (which is desirable) and within the range there is always undesired noise, particularly from the mains (50 or 60 Hz) and its harmonics, together with the noise of untested components and the noise of a power supply. In order to obviate these disadvantages, the device according to the invention preferably comprises autonomous means for the electric power supply of the selection means and the processing means. The autonomous supply means can also be used for supplying the biasing means. It is also preferable for the components other than that which has been selected to be earthed or grounded. In the part of the device which is electrically decoupled from the control means, it is also preferable to use low noise level elements. It will be shown hereinafter that certain means of the device require commutators. It is then preferable to use for the latter relays having a high electrical insulation and which consequently have a negligible influence on the noise measurements. For example, use is made of relays of the type marketed by the SEEM company under the reference R608.

According to a special embodiment, the control means are connected to selection means and to biasing and processing means via optocoupler links.

This leads to a considerable reduction in the sources of background noise, which can disturb the measurements and in particular with respect to the mains.

The device according to the invention can also comprise other measuring means, which are able to determine at least one characteristic, other than the noise, of the selected component and which are controlled by the control means and configuration means able to select either the measuring means or the other measuring means and which are controlled by the control means and electrically decoupled from the latter.

Thus, for each component several measurements can be carried out without requiring supplementary manipulation. The choice of tests to be carried out is performed beforehand by the user.

Preferably, the configuration means include a plurality of relays with a high electrical insulation and which are controlled by the control means, via optocoupler links, and whose opening or closing makes it possible to select the noise measurement or the measurement of a characteristic other than the noise.

According to a preferred embodiment, the selection means comprise connection points for the connection of the components to be tested, each connection point being connected to a first and a second high electrical insulation relay, connected in inverter form, the first relay also being connected to ground or earth, the second relay also being connected to the measuring means, the relays connected to the different connection points being controlled by the control means.

According to another preferred embodiment, when the device has the other measuring means and the configuration means, the selection means have connection points for the connection of components to be tested, each connection point being connected to a first and a second high electrical insulation relay, connected in inverter form, the first relay also being connected to earth or ground, the second relay also being connected to the configuration means, the relays connected to the different connection points being controlled by the control means.

Finally, the analysis means can comprise a spectrum analyser.

BRIEF DESCRIPTION OF THE DRAWINGS

The invention is described in greater detail hereinafter relative to non-limitative embodiments and the attached drawings, wherein FIG. 1 diagrammatically shows a device according to the invention.

DETAILED DESCRIPTION OF THE PREFERRED EMBODIMENT

Figure 1:
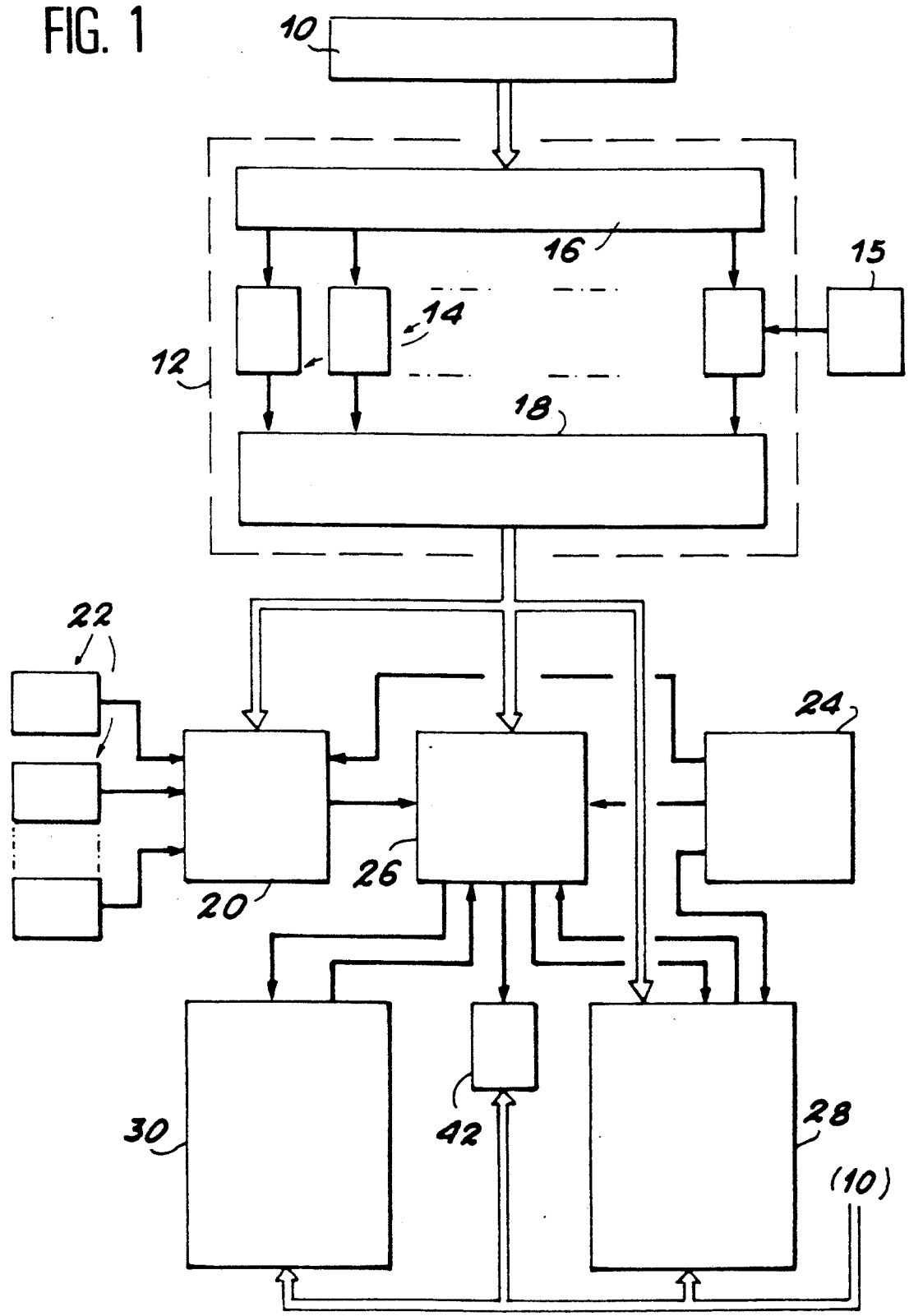
Figure 3:
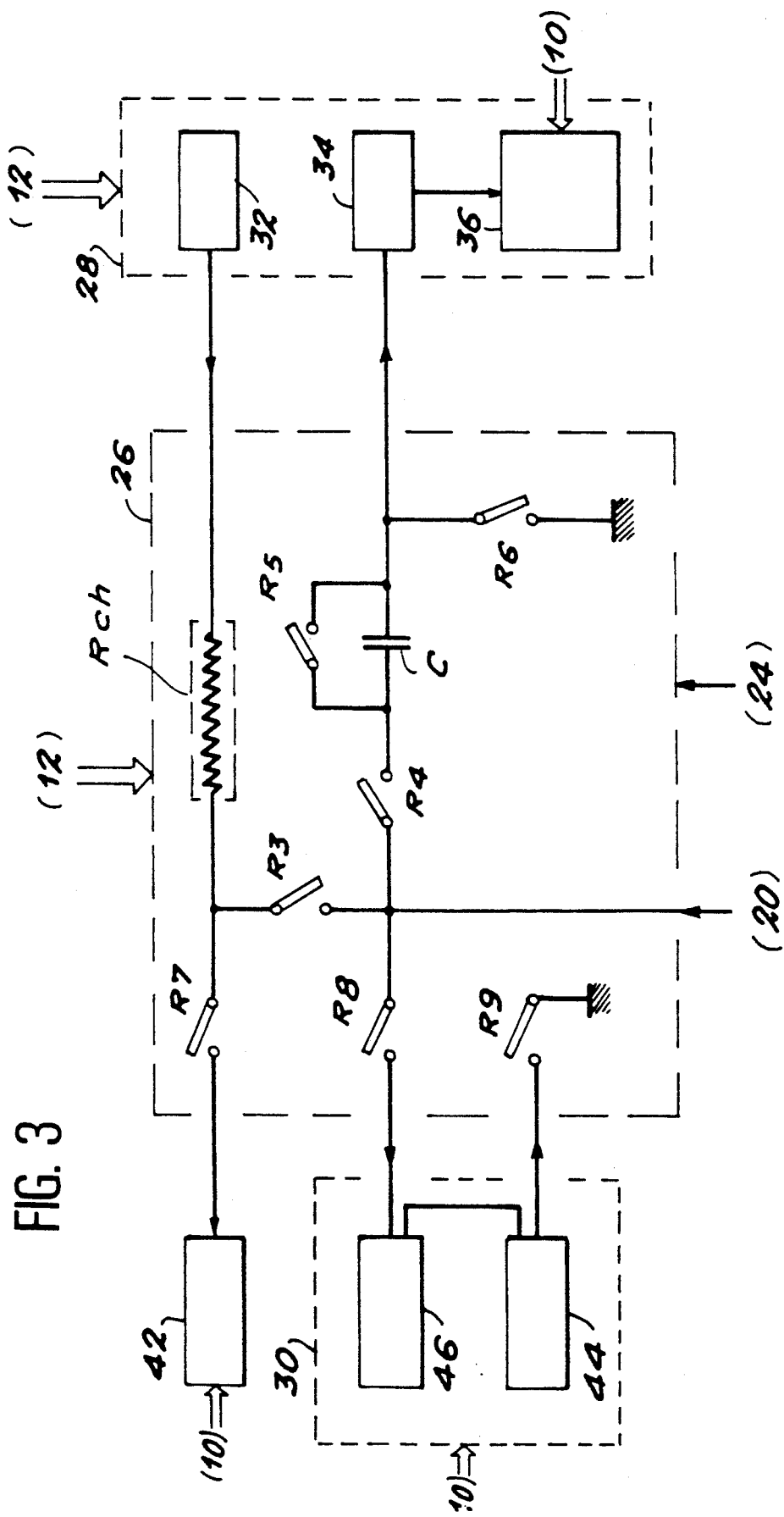
FIG. 3 diagrammatically shows a special embodiment of the configuration means used in the device according to the invention and FIG. 4 diagrammatically shows a biasing system used in the device according to the invention.

A device according to the invention is diagrammatically illustrated by FIG. 1. This device comprises a so-called "external" part and a so-called "internal" part, which is electrically decoupled from the external part. The references for the elements belonging respectively to the said parts will now be given and the nature of these various elements will be indicated hereinafter. The internal part contains the elements 12, 24, 26, 32 and 34. The external part contains the elements 10, 15, 30, 36 (cf. FIG. 3) and 42, as well as the components 22 which it is wished to test. The elements 30, 36 and 42 are controlled by a computer (element 10) directly via the external part.

In the device shown in FIG. 1, the computer 10, e.g. a microcomputer, manages and controls the complete device. It belongs to the external part of the device and is connected to its internal part via an interface 12. The latter has optocoupler links 14. A bus 16 (e.g. of type IEEE 488) makes it possible to supply the optocouplers 14 with the control instructions from the computer 10. The optocouplers 14 permit the electrical insulation of the associated computer 10 and consequently a reduction in any noise which might disturb the measurements. The optocouplers 14 transmit the informations through the output means 18, which supplies the control instructions on e.g. thirty two bits.

The optocouplers 14 can be supplied with electric power by a power supply 15 in FIG. 1 and belonging to the external part of the device. As a variant, the power supply for the optocouplers 14 is taken from the computer 10.

The computer 10 is connected via the interface 12 to selection means 20. The electronic components to be tested 22 are connected beforehand to said selection means 20. The latter, controlled by the computer 10 by a signal coded on e.g. eight bits, successively select the components 22 for their successive characterization. The term components is understood to mean either different components, or different measuring points of a complex integrated component.

Figure 2:
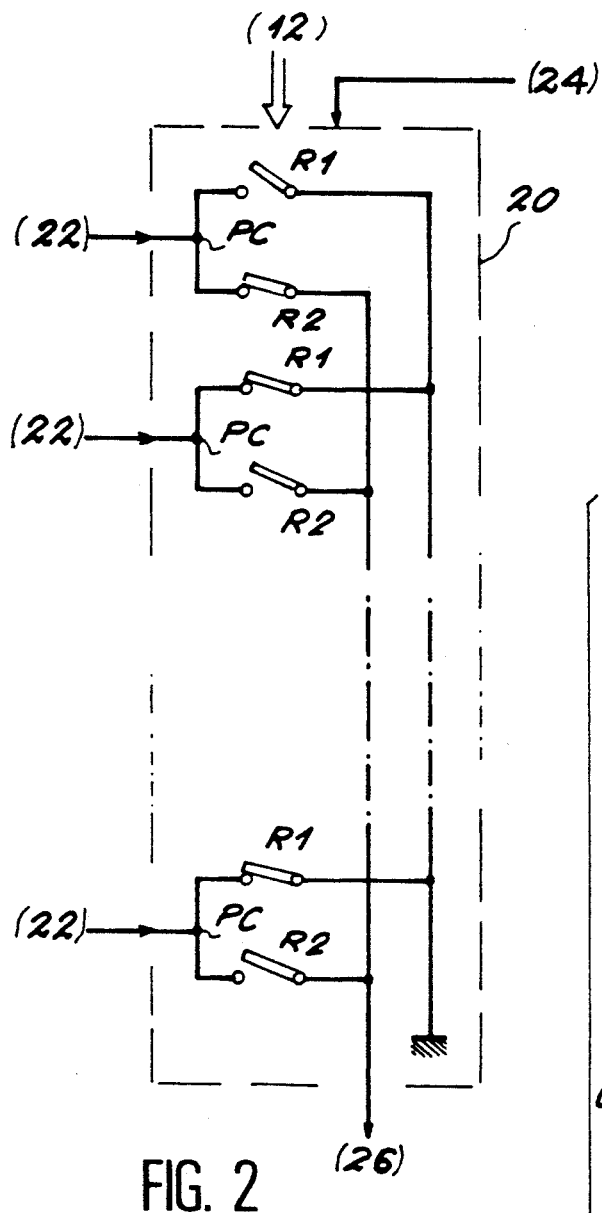
FIG. 2 diagrammatically shows a special embodiment of the selection means used in the device according to the invention.

FIG. 2 diagrammatically shows an embodiment of the means 20 making it possible to select a component without supplying any unwanted noise. The components 22 are connected to the selection means 20 at connection points PC. The selection of a component is ensured by sets of relays R1 and R2, connected in inverter manner, and interconnected at each connection point PC. The relays R1, R2 have a high electrical insulation and low noise, e.g. of the type marketed by SEEM under reference R608.

The opening of the first relay R1 and the closing of the second relay R2 in simultaneous manner makes it possible to introduce the selected component into the measuring circuit.

In the represented example, a single component 22 is selected for the noise measurement and possibly other measurements, via the single relay R2 which is then closed and the other components 22 are all connected to ground via the relays R1. This is the best way of working for measuring noise because, in this way, the unselected components do not disturb the noise measurement performed on the selected component. For each unselected component, the closure of the first relay R1, which has a grounded terminal, and the opening of the second relay R2 disconnect the said component from the measuring circuit.

On returning once again to FIG. 1, it is possible to see the selection means 20 for the supply of the relays R1, R2 are connected to an autonomous general power supply 24, advantageously constituted by rechargeable nickel-cadmium accumulators or batteries, e.g. of the type marketed by SAFT under reference 10 Ah. The use of autonomous means to supply power such as accumulators makes it possible to avoid the introduction of unwanted noise from the mains.

Thus, the measuring system is virtually insulated or isolated from its environment, which is not essential for conventional signal measurements, but which is essential for noise measurements in the low frequency range, particularly due to the unwanted noise problems resulting from the 50 or 60 Hz mains and the harmonics thereof.

The configuration means 26 connected to the selection means 20 and supplied by the autonomous general power supply 24 make it possible to select measuring means 28 or 30 for determining the noise or another characteristic. In the example shown, the configuration means 26 are connected to the means 28 for determining the noise level produced by the tested component and to the means 30 for determining the current-voltage characteristic of the tested component (curve I(V)). The configuration means 26 and the associated measuring means 28, 30 will be described with reference to FIG. 3.

In the example shown, where two measuring means 28 and 30 are used, a particular function is selected by the opening or closing of the relays R3 . . . R9. These relays R3 to R9 are connected in the manner indicated in FIG. 3 and are controlled by the computer 10 via the interface 12. These relays can be of the type marketed by SEEM under reference R608 and are supplied by the general power supply 24.

For the selection of the means 28 for determining the noise level produced by the component switched in by the selection means 20, the relays R3 and R4 are closed. The function of the relay R3 is to connect, via a load resistor Rch, the component to be characterized to biasing means 32 forming part of the means 28 and which make it possible to measure the noise on the thus biased component.

The function of the relay R4 is to connect the component to be measured to a preamplifier 34 forming part of the means 28. It is pointed out that the means 28 for determining the noise level are, in conventional manner, constituted by biasing means 32 for biasing the selected component and the preamplifier 34, e.g. of type PAR 184 marketed by EGG Instruments, the means 32 and the preamplifier 34 being supplied by the autonomous general power supply 24.

The measuring means 28 also incorporate a spectrum analyser 36, whose input is connected to the output of the preamplifier 34 and which is e.g. of the type marketed by Hewlett-Packard under reference HP 3561. This analyser 36 belongs to the external part of the device and is supplied from the mains and directly controlled by the computer 10, which does not limit the noise measurements.

Figure 4:
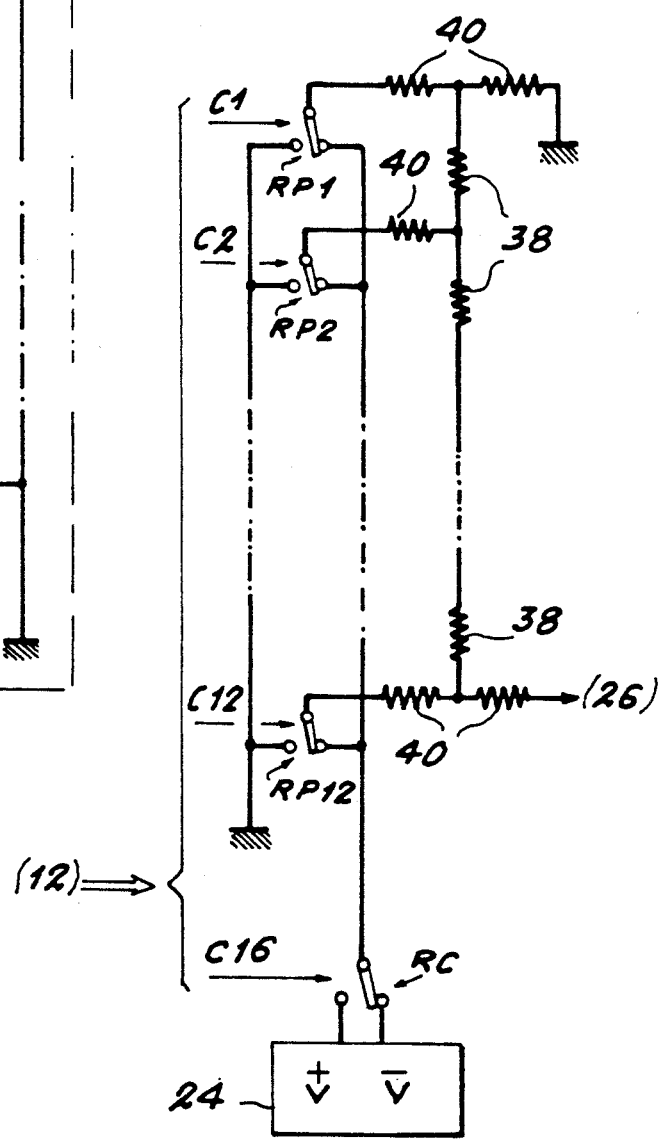

The biasing is chosen by the computer via the interface 12. The choice of the biasing is e.g. carried out by means of a signal coded on sixteen bits. As can be seen in FIG. 4, which is the circuit diagram of a biasing system usable with the device of FIG. 3, twelve of the said bits permit the control C1 ... C12 of twelve relays RP1 ... RP12, e.g. of type R625 marketed by SEEM.

Each of these relays can be connected either to ground, or to a stage of a voltage divider system, each stage being formed by two resistors 38,40. For example, the resistors 38 are of 100 kohms, while the resistors 40 have double this value. This type of voltage divider system is well known and requires no more detailed description.

The biasing can be positive, negative or zero. Zero bias is obtained by switching all the relays RP1 to RP12 to ground. The positive (+V) and negative (−V) biases are chosen via the controls C16 of a relay RC connected to the general power supply 24 and as shown in FIG. 4. The biasing value is obtained by the control of the number of relays RP1 to RP12 in adequate form, e.g. in absolute values this can range between 0 and 30 V for an autonomous power supply 24 of 30 V.

For a systematic use of the device with a zero bias, the biasing means 32 can be constituted by a simple ground connection.

On returning to FIG. 3, it is possible to see that the relay R3 is connected to the biasing means 32 of the means 28. A link capacitor C permits the insulation with respect to the preamplifier 34. The relay R5 is connected between the terminals of the capacitor C. During a zero bias measurement, the capacitor C is not necessary and is then shunted by the closing of the relay R5, which leads to a time gain and to an optimum procedure.

Moreover, during the charging of the link capacitor C, the input of the preamplifier 34 is grounded by the closing of the relay R6, which avoids the saturation of the preamplifier 34. The relay R6 is opened again prior to the measurement.

The closure of the relay R7 permits the switching in of a voltmeter 42 making it possible to check the biasing value. This voltmeter 42 belongs to the external part of the device shown in FIG. 1.

For the determination of the current-voltage characteristic, the configuration means 26 have the two relays R8 and R9, whose closure permits the switching in of a variable power supply 44 and a picoammeter 46, which form the means 30. The power supply 44 and the picoammeter 46 are advantageously in the external part of the device of FIG. 1 (being supplied by the mains and controlled by the computer 10), which does not limit the precision of the current-voltage characteristic measurement.

This would also apply if they were in the internal part of the device, but then the noise measurement might be disturbed. In the same way, the voltmeter 42 and the spectrum analyser 36 could be in the internal part of the device, but the noise measurement could be disturbed.

For each selected component, the current-voltage characteristic is obtained in conventional manner by varying the voltage supplied by the power supply 44 and by measuring the current with the aid of the picoammeter 46 (relays R3 and R4 being open).

Thus, a device according to the invention makes it possible to automatically carry out series of measurements permitting the detection of structural or manufacturing defects on the part of electronic components. In the construction described, the noise level measurements are very sensitive, the noise of the actual device being very low.

Obviously the invention is not limited to the specific embodiment described and numerous variants can be made thereto without passing beyond the scope of the invention and in particular other measuring means could be connected to the configuration means for determining supplementary characteristics.

We claim:

1. A device for measuring the noise of electronic components (22), comprising selection means (20) to which are connected the components and which are able to select one of these components, measuring means (28) able to determine the noise of the selected component, said measuring means incorporating means (32, 34) for biasing the selected component and for processing signals supplied by the thus biased selected component and also incorporating analysis means (36) determining the noise from signals supplied by the processing means, as well as means (10) for controlling the selection means (20) and measuring means (28), said control means (10) being electrically decoupled from the selection means (20) and the biasing and processing means (32, 34), said device also comprising an electrical power supply (24) for the selection means (20), the processing means (34), and the biasing means (32), the components, other than that which has been selected, being grounded.

2. A device according to claim 1, wherein the measuring means (28) are able to determine the noise of the selected component in at least part of the frequency range 0.01 Hz to 1 MHz.

3. A device according to claim 1, wherein the control means (10) are connected to the selection means (20) and to the biasing and processing means (32, 34) via optocoupler links (14).

4. A device according to claim 1, further comprising other measuring means (30), which are able to determine at least one characteristic, other than the noise, of the selected component and which are controlled by the control means (10) and configuration means (26) able to select either the said measuring means (28) or the said other measuring means (30) and which are controlled by the control means (10) and electrically decoupled therefrom.

5. A device according to claim 4, wherein the configuration means (26) comprise a plurality of high electrical insulation relays (R3 to R9) controlled by the control means (10), via optocoupler links (14) and whose opening or closing makes it possible to select the noise measurement or the measurement of a characteristic other than the noise.

6. A device according to claim 4, wherein the selection means (20) comprise connection points (PC) for the connection of the components (22) to be tested, each connection point (PC) being connected to a first and a second high electrical insulation relays (R1, R2), connected in inverter manner, the first relay (R1) also being grounded, the second relay (R2) also being connected to the configuration means (26), the relays (R1, R2) connected to the different connection points (PC) being controlled by the control means (10).

7. A device according to claim 1, wherein the selection means (20) comprise connection points (PC) for the connection of the components (22) to be tested, each connection point (PC) being connected to a first and a second high electrical insulation relay (R1, R2), connected in inverter manner, the first relay (R1) also being grounded, the second relay (R2) also being connected to the measuring means (28), the relays (R1, R2) connected to the different connection points (PC) being controlled by the control means (10).

8. A device according to claim 1, wherein the analysis means comprise a spectrum analyser (36).

9. A device according to claim 4, wherein the configuration means are connected to the electrical power supply.

* * * * *